(12) United States Patent
Tan et al.

(10) Patent No.: US 10,707,408 B2
(45) Date of Patent: Jul. 7, 2020

(54) HALL EFFECT SENSOR WITH ENHANCED SENSITIVITY AND METHOD FOR PRODUCING THE SAME

(71) Applicant: GLOBALFOUNDRIES Singapore Pte. Ltd., Singapore (SG)

(72) Inventors: Shyue Seng Tan, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/200,079

(22) Filed: Nov. 26, 2018

(65) Prior Publication Data
US 2019/0097126 A1  Mar. 28, 2019

Related U.S. Application Data

(62) Division of application No. 15/666,243, filed on Aug. 1, 2017, now Pat. No. 10,177,304.

(51) Int. Cl.
*H01L 43/06* (2006.01)
*H01L 43/14* (2006.01)
*H01L 43/04* (2006.01)
*H01L 27/22* (2006.01)

(52) U.S. Cl.
CPC .......... *H01L 43/065* (2013.01); *H01L 27/22* (2013.01); *H01L 43/04* (2013.01); *H01L 43/14* (2013.01)

(58) Field of Classification Search
CPC ....... H01L 43/065; H01L 43/04; H01L 43/14; H01L 27/22
See application file for complete search history.

(56) References Cited

U.S. PATENT DOCUMENTS

| | | | |
|---|---|---|---|
| 6,278,271 B1 * | 8/2001 | Schott | G01R 33/0206 257/422 |
| 9,696,390 B2 | 7/2017 | Zieren et al. | |
| 9,952,291 B2 | 4/2018 | Crescentini et al. | |
| 2010/0219821 A1 * | 9/2010 | Rocznik | G01R 33/07 324/251 |

(Continued)

OTHER PUBLICATIONS

Walter Schwarzenbach . . . , Atomic Scale Thickness Control of SOI Wafers for Fully Depleted Applications, ECS Trans. 2013 vol. 53, issue 5, 39-46 (Year: 2013).*

(Continued)

*Primary Examiner* — Mark W Tornow
(74) *Attorney, Agent, or Firm* — Ditthavong & Steiner P.C.

(57) ABSTRACT

Methods of forming a high sensitivity Hall effect sensor having a thin Hall plate and the resulting devices are provided. Embodiments include providing a SOI substrate having a sequentially formed Si substrate and BOX and Si layers; forming a first STI structure in a first portion of the Si layer above the BOX layer, the first STI structure having a cross-shaped pattern; forming a second STI structure in a frame-shaped pattern in a second portion of the Si layer; the second STI structure formed outside and adjacent to the first STI structure; removing a portion of the Si layer between the first and second STI structures down to the BOX layer; removing the first STI structure, a cross-shaped Si layer remaining; and implanting N+ dopant ions into each end of the cross-shaped Si layer to form N+ implantation regions.

19 Claims, 5 Drawing Sheets

(56) References Cited

U.S. PATENT DOCUMENTS

| | | |
|---|---|---|
| 2014/0070795 A1 | 3/2014 | Kolb et al. |
| 2014/0175528 A1* | 6/2014 | Zieren .................. G01R 33/066 257/295 |
| 2014/0184211 A1* | 7/2014 | Fujita ................. G01R 33/0052 324/225 |
| 2015/0255709 A1* | 9/2015 | Hebert .................. H01L 43/065 257/427 |
| 2016/0003923 A1* | 1/2016 | Zieren ................ G01R 33/0206 324/252 |
| 2017/0288131 A1 | 10/2017 | Sun et al. |

OTHER PUBLICATIONS

R.S. Popovic, Hall devices for magnetic sensor microsystems, Aug. 6, 2002 (Year: 2002).*

L. Portmann ; H. Ballan ; M. Declercq, A SOI CMOS Hall effect sensor architecture for high temperature applications (up to 300/spl deg/C), Nov. 7, 2002 (Year: 2002).*

* cited by examiner

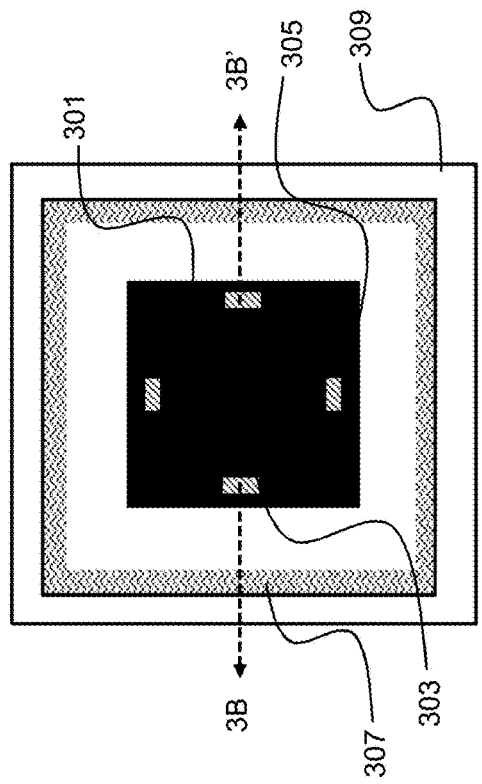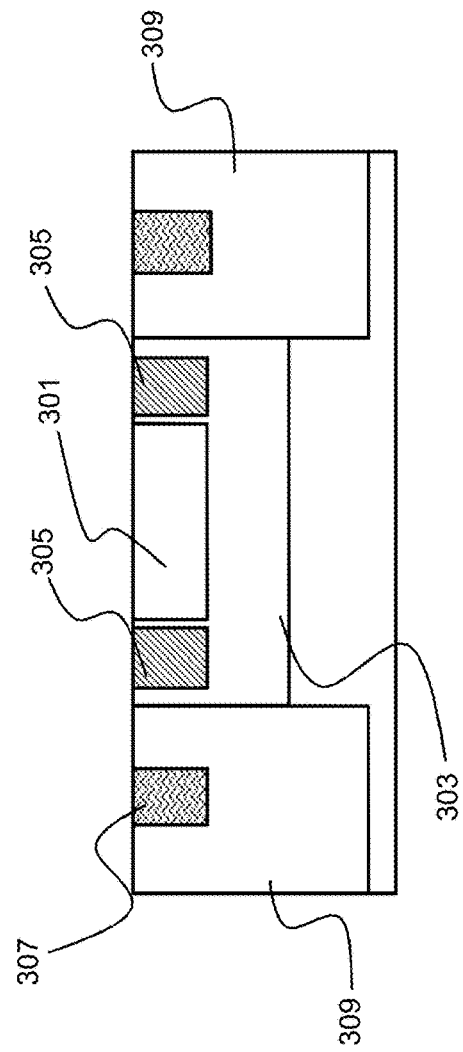
FIG. 3A (Background Art)
FIG. 3B (Background Art)

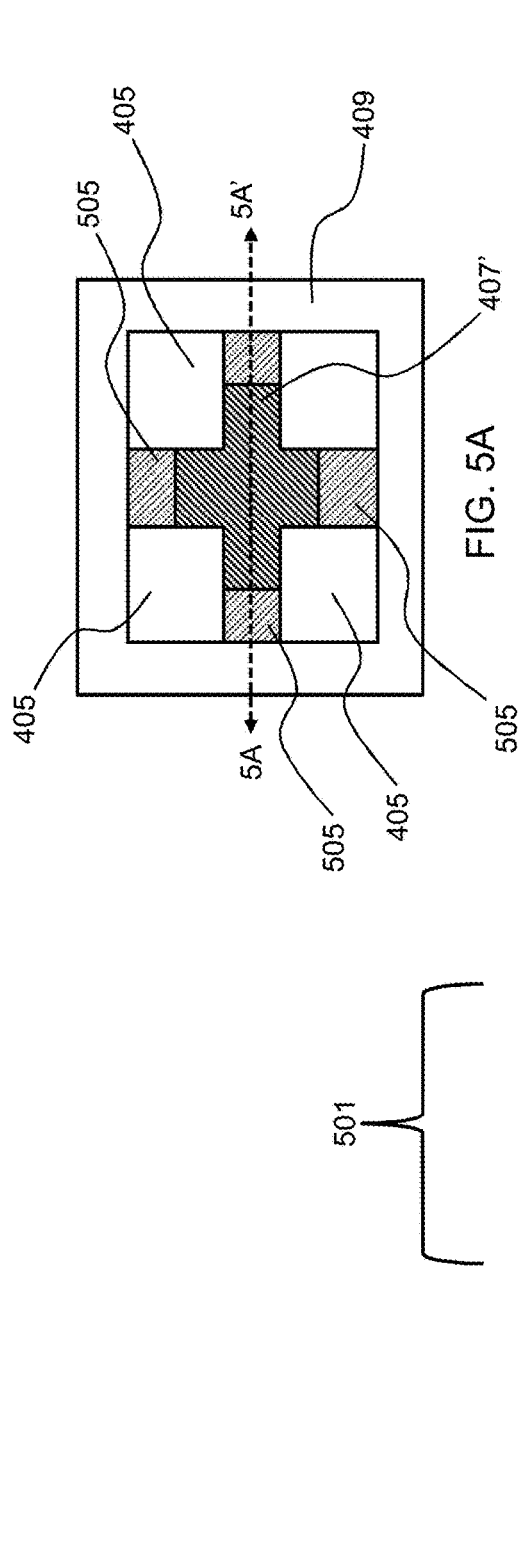

HALL EFFECT SENSOR WITH ENHANCED SENSITIVITY AND METHOD FOR PRODUCING THE SAME

RELATED APPLICATION

The present application is Divisional application of application Ser. No. 15/666,243, filed on Aug. 1, 2017, which is incorporated herein by reference in its entirety.

TECHNICAL FIELD

The present disclosure relates to semiconductor fabrication and to the resulting device. In particular, the present disclosure relates to a Hall sensor device having an enhanced sensitivity and formed on a radio frequency silicon-on-insulator (RFSOI).

BACKGROUND

A Hall effect sensor is a transducer that varies its output voltage in response to a magnetic field. Hall sensor devices can sense a magnetic field perpendicular to a chip in which a Hall plate of the Hall effect sensor is formed. Hall effect sensors can be used for proximity switching, positioning, speed detection, and current sensing applications.

Referring to FIG. 1, the Hall voltage ($V_H$) in a Hall plate 101 is determined by the equation: $V_H=IB/qnt$, wherein "I" represents the current, as depicted by the arrow 103, "B" represents the magnetic field, as depicted by the arrows 105, "q" represents the elementary charge of an electron, "n" represents a doping concentration of the plate 101, as depicted by the + and − symbols 107, and "t" represents the thickness of the plate 101, as depicted by the arrow 109. The sensitivity of a Hall effect sensor can be determined by the Hall voltage equation $V_H$ above. An important factor in determining the sensitivity of a Hall effect sensor is high electron mobility.

As illustrated in FIGS. 2A and 2B (top view and cross-sectional view, respectively), a conventional integrated Hall sensor is generally formed by providing a P+ type doping layer 201 in an N well (NW) 203 above a p-type substrate (p-sub) 205 to control the depletion layer in the NW 203. In this instance, N+ type dopant regions 207 are formed at opposite sides of the P+ type doping layer 201 in which a current flows therebetween, as depicted by the arrow 209. Here, the NW 203 is required to be sufficiently deep to accommodate the P+ type doping layer 201, which reduces the sensitivity of the Hall sensor.

Referring to FIGS. 3A and 3B (top view and cross-sectional view along the line 3B-3B', respectively), another conventional integrated Hall sensor is generally formed by providing a p-type lightly doped drain (MVPLDD) layer 301 in an N well (also referred to as an N+ Hall plate (NH)) 303 between two N+ type dopant regions 305. Additionally, a guard-ring 307 is formed around the N Well 303 and within a P well (PW) 309. Similar to the Hall sensor of FIGS. 2A and 2B, the N well 303 is required to be sufficiently deep to accommodate the MVPLDD layer 301 therein, which again reduces the sensitivity of the Hall sensor.

A need therefore exists for methodology enabling the formation of an integrated Hall effect sensor with a thin Hall plate to enable high sensitivity.

SUMMARY

An aspect of the present disclosure is a process of forming a Hall effect sensor with a thin Hall plate to enhance sensitivity.

Another aspect of the present disclosure is a Hall effect sensor with a thin Hall plate to enhance sensitivity.

An additional aspect of the present disclosure is a Hall effect sensor with a front and a back gate to induce depletion to further enhance sensitivity. Further aspects of the present disclosure include a Hall plate with reduced or omitted doping therein to further enhance sensitivity thereof.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a silicon-on-insulator (SOI) substrate having a sequentially formed silicon (Si) substrate and buried oxide (BOX) and Si layers; forming a first shallow trench isolation (STI) structure in a first portion of the Si layer above the BOX layer, the first STI structure having a cross-shaped pattern; forming a second STI structure in a frame-shaped pattern in a second portion of the Si layer; the second STI structure formed outside and adjacent to the first STI structure; removing a remaining portion of the Si layer between the first and second STI structures down to the BOX layer; removing the first STI structure, a cross-shaped Si layer remaining; and implanting N+ dopant ions into each end of the cross-shaped Si layer to form N+ implantation regions.

Aspects of the present disclosure include forming the first STI structure by: etching or oxidizing a trench partially through the first portion of the Si layer to a depth of 100 angstrom (Å) to 1000 Å above the BOX layer; filling the trench with a dielectric layer; and planarizing the dielectric layer down to the Si layer. Other aspects include etching or oxidizing the trench partially through the first portion of the Si layer to a depth of 600 Å. Further aspects include the SOI substrate being a partially-depleted silicon-on-insulator (PDSOI). Additional aspects include the BOX layer having a thickness of 140 nm to 200 nm. Yet other aspects include the BOX layer being an ultra-thin BOX (UTBOX) layer having a thickness of 10 nm to 30 nm. Other aspects include implanting n-type dopant on the cross-shaped Si layer prior to implanting the N+ dopant ions. Additional aspects include forming a front and a back gate on opposite sides of the cross-shaped Si layer.

Another aspect of the present disclosure is a device including: an STI structure formed in a frame-shaped pattern through a Si layer to a BOX layer of an SOI substrate; a cross-shaped Si layer over the BOX layer, the cross-shaped Si layer within and adjacent to the frame-shaped STI structure; and N+ type ion-doped implantation regions at opposite ends of the cross-shaped Si layer.

Aspects of the device include the cross-shaped Si layer having a thickness of 100 Å to 1000 Å. Other aspects include the BOX layer having a thickness of 140 nm to 200 nm. Additional aspects include the BOX layer having a thickness of 200 nm. Yet additional aspects include the BOX layer being an UTBOX layer having a thickness of 10 nm to 30 nm. Further aspects include a front and a back gate over opposite sides of the cross-shaped Si layer.

Another aspect of the present disclosure is a method including: providing a SOI substrate having a sequentially formed Si substrate and an UTBOX and Si layers; forming a first STI structure in a first portion of the Si layer above the UTBOX layer, the first STI structure having a cross-shaped pattern; forming a second STI structure in a frame-shaped pattern in a second portion of the Si layer; the second STI structure formed outside and adjacent to the first STI structure; removing a remaining portion of the Si layer between the first and second STI structures down to the UTBOX layer; removing the first STI structure, a cross-shaped Si layer remaining; and implanting N+ dopant ions into each end of the cross-shaped Si layer to form N+ implantation regions.

Aspects of the present disclosure include forming the first STI structure by: etching or oxidizing a trench partially through the first portion of the Si layer to a depth of 100 Å to 1000 Å above the UTBOX layer; filling the trench with a dielectric layer; and planarizing the dielectric layer down to the Si layer. Additional aspects include the SOI substrate being a PDSOI. Other aspects include the UTBOX layer having a thickness of 10 nm to 30 nm. Further aspects include implanting an n-type dopant on the cross-shaped Si layer prior to implanting the N+ dopant ions. Another aspect includes forming a front and a back gate on opposite sides of the cross-shaped Si layer. Other aspects include forming a complementary metal-oxide-semiconductor (CMOS) circuit above the cross-shaped Si plate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A and 3B schematically illustrate a top view and a cross-sectional view, respectively, of another conventional integrated Hall sensor;

FIG. 5A schematically illustrates a top view of a high sensitivity Hall sensor device, in accordance with an exemplary embodiment; and FIG. 5B schematically illustrates a cross-sectional view of FIG. 5A and an integrated CMOS circuit.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of limited sensitivity of a Hall sensor attendant upon forming a conventional bulk hall device with a requirement for a thick Hall plate structure. In accordance with embodiments of the present disclosure, a Hall effect sensor is formed with a thin Hall plate. Also in accordance with an embodiment of the present disclosure, a Hall effect sensor can be formed with a front and a back gate to induce depletion to further enhance sensitivity. Further, in accordance with an embodiment of the present disclosure, doping can be reduced or omitted in the Hall plate to further improve sensitivity of the Hall effect sensor.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
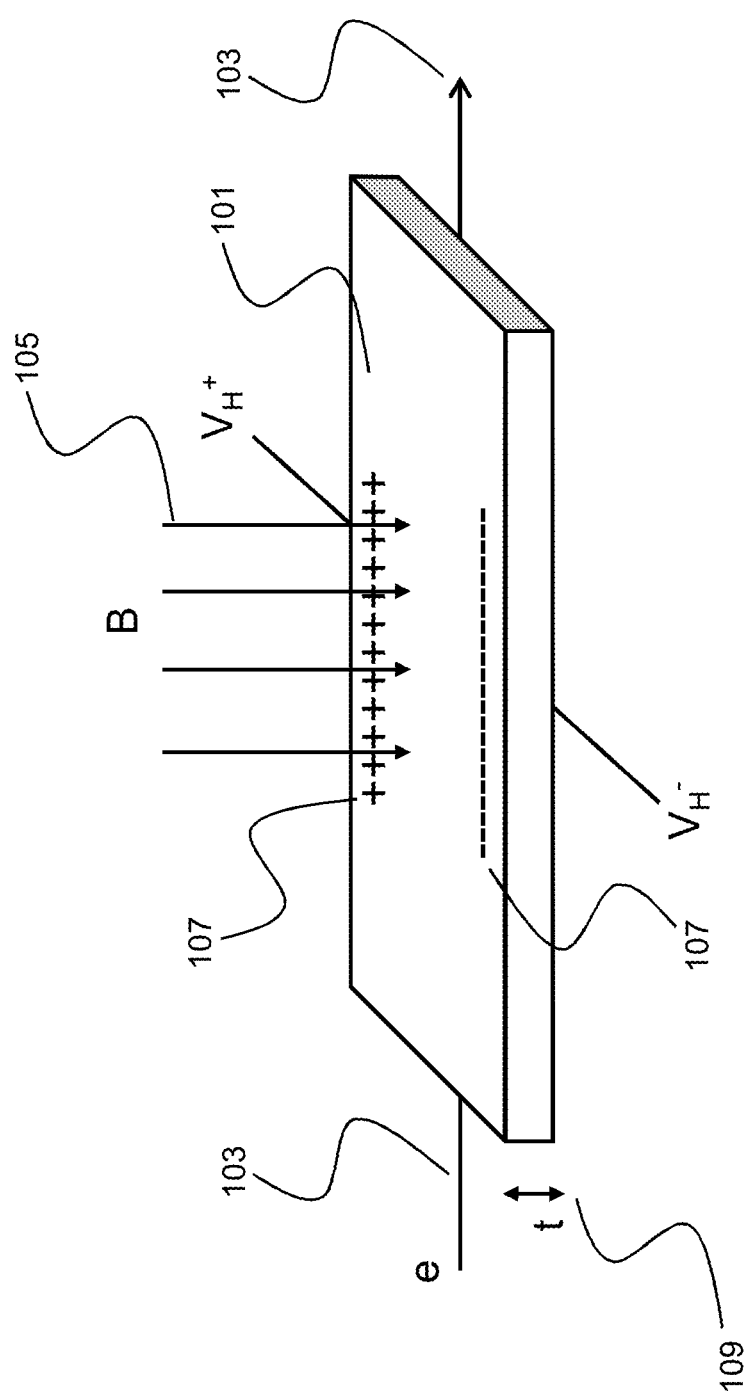
FIG. 1 schematically illustrates a conventional Hall plate and its properties.
Figure 2A:
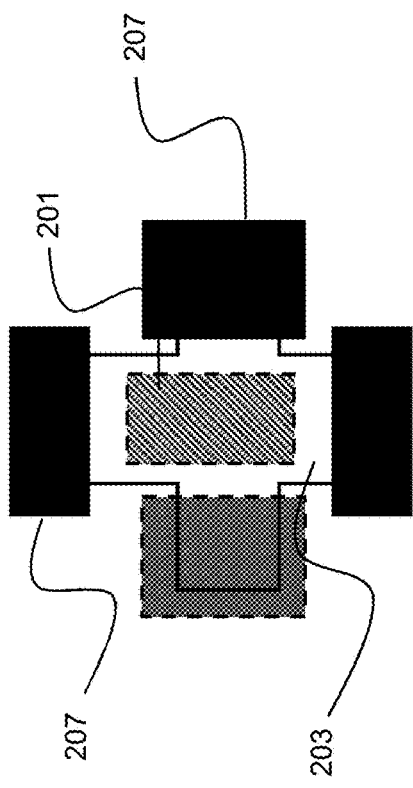
FIGS. 2A and 2B schematically illustrate a top view and a cross-sectional view, respectively, of a conventional integrated Hall sensor.
Figure 2B:
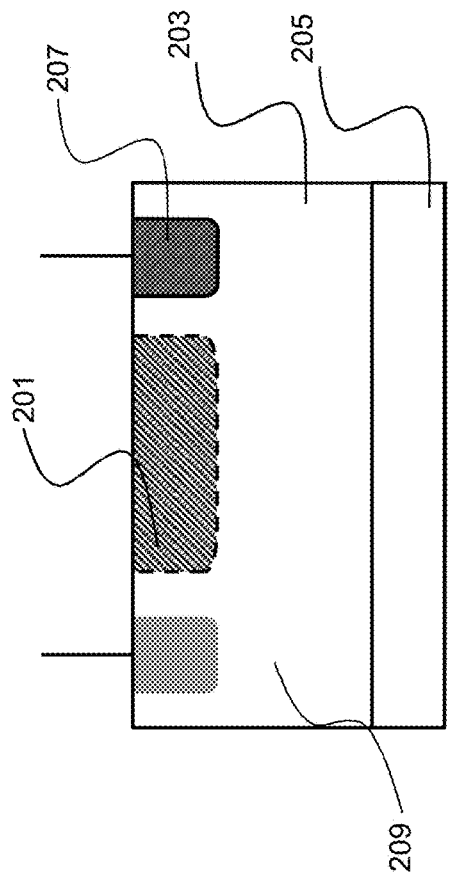
Figure 4:
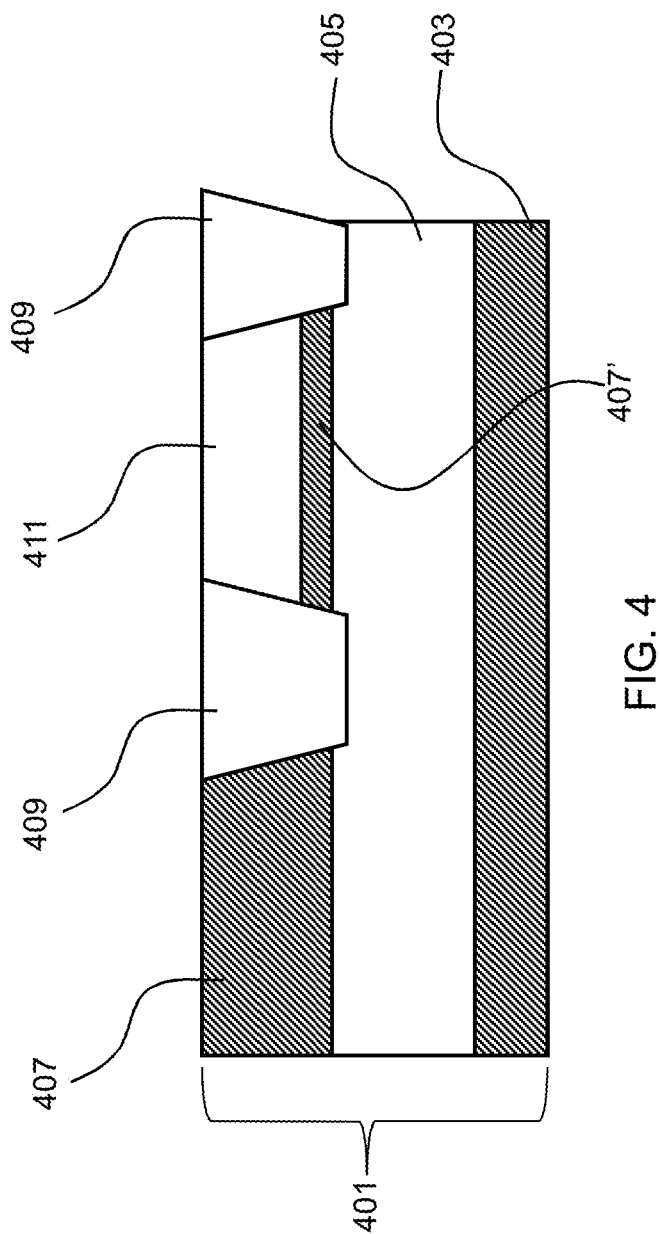
FIG. 4 schematically illustrates a cross-sectional view of a fabrication process step for a high sensitivity Hall sensor device, in accordance with an exemplary embodiment.

FIG. 4 schematically illustrates a cross-sectional view of a fabrication process step for a high sensitivity Hall sensor device, in accordance with an exemplary embodiment. Referring to FIG. 4, a SOI substrate 401 is provided with a sequentially formed silicon substrate layer 403, a BOX layer 405, and a Si layer 407. Alternatively, a PD-SOI substrate (not shown for illustrative convenience) may be substituted for the SOI substrate 401. The BOX layer 405 may be formed, for example, to a thickness of 140 nm to 200 nm depending on the application and desired results. Alternatively, an UTBOX layer (not shown for illustrative convenience), e.g., having a thickness of 10 nm to 30 nm, may be substituted for the BOX layer 405.

Referring to FIG. 4, the STI structures 409 and 411 may be formed, e.g., by etching or oxidizing a pair of trenches or a single trench having different depths and widths in the Si layer 407. As illustrated in FIG. 4, the regions of the SOI substrate 401 where the STI structures 409 are to be formed is created by first forming a trench (not shown for illustrative convenience), e.g., by etching, having a depth that extends through the Si layer 407, while the region where the STI structure 411 is to be formed is created by first forming a trench (not shown for illustrative convenience), e.g., by etching or oxidizing the Si layer 407, partially through the Si layer 407, for example, to a depth of 100 Å to 1000 Å, e.g. 600 Å, above the BOX layer 405, forming the Si layer 407'. The trench for the STI structure 411 may be formed, e.g., with a width and length of 10 nm×10 nm or 20 nm×20 nm, to allow the Si layer 407' (Hall plate) to be of a sufficient size to sense a magnetic field when operating as a Hall effect sensor. Thereafter, the trenches are filed with a dielectric material and the dielectric material is planarized, e.g., by chemical mechanical polishing (CMP), down to the Si layer 407. While not illustrated, the STI structure 411 is formed in a cross-shaped pattern within and adjacent to the STI structure 409, which is formed of a frame-shaped pattern to accommodate an appropriate size of an operational Hall effect sensor circuit.

After the STI structures 409 and 411 are formed, these structures are used as a mask during an additional etching process wherein the remaining exposed portions of the silicon layer 407' not covered by the STI structures 409 and 411 are etched, thereby exposing the BOX layer 405 below.

FIG. 5B illustrates a cross-sectional view of FIG. 5A along the line 5A-5A' and a CMOS circuit 501 integrated on the SOI substrate 401. FIGS. 5A and 5B follow and illustrate the completed process step of FIG. 4. For the purpose of illustrative convenience, the left side of FIG. 5B is depicted as being separated from the right side thereof by lines 503; however, it is contemplated that the CMOS circuit 501 and the Hall device of FIGS. 5A and 5B are integrated. As illustrated in FIGS. 5A and 5B, once the exposed portions of the Si layer 407' are etched down to the BOX layer 405, the STI structure 411 of FIG. 4 is then etched away during another etching process (not shown for illustrative convenience) to expose the underlying Si layer 407' (Hall plate) previously etched, for example, to a thickness of 100 Å to 1000 Å, e.g., 600 Å, which is illustrated in FIG. 5A by the cross-shaped pattern. In an embodiment of the present disclosure, the remaining Si layer 407' (Hall plate) will have the same cross-shaped pattern as the removed STI structure 411 and may be formed as an N well by implanting N-type dopant ions therein after the process of removing the STI structure 411. Consequently, the thin Si layer 407' acts as a thinned Hall plate structure. Alternatively, to further enhance the sensitivity of the Hall sensor device, in accordance with an embodiment of the present disclosure, the process of forming the N well in the Si layer 407' by ion implantation of an n-type dopant may be omitted to result in an un-doped Hall plate, which can further increase the sensitivity of the overall Hall device. Further, the process of implanting N type dopant ions into the Si layer 407' may be performed to a lesser degree to result in the desired sensitivity of the overall thinned Hall plate since the lesser the dosing of a dopant, the higher the sensitivity of the Hall plate structure.

Still referring to FIGS. 5A and 5B, implantation regions 505 may be formed at each outer end of the thinned Si layer 407' (or thinned Hall plate structure). The regions 505 may be formed, e.g., by selectively implanting N+ type dopant ions, e.g., at a concentration of 5E14 per centimeter cubed ($cm^3$) to 9E15 $cm^3$, in the Si layer 407' using a hard mask and/or photoresist (not shown for illustrative convenience).

The implantation regions 505 are formed such that a current can be induced through the etched Hall plate structure. Further, a voltage can be measured across the thinned Hall plate structure (Si layer 407') through the remaining two opposing implantation regions 505. The voltage is measured between two implantation regions 505 perpendicular to the induced current flow between the two other implantation regions 505. Referring to FIGS. 5A and 5B, the STI structure 409 of FIG. 4 is left in place to isolate the circuitry of the completed thinned Hall sensor device from other externally formed circuits.

As illustrated in the right side of FIG. 5B, contact leads 507 and 509 may be connected to opposing N+ implantation regions 505. For example, a $V_{Bias}$ lead 507 can be connected to one N+ implantation region 505 while a ground (Gnd) lead 509 can be connected to the opposing N+ implantation region 505.

After the formation of the high sensitivity Hall device as described above, additional processes of forming, for example, a CMOS circuit 501 to be integrated with the thinned Hall plate structure can be performed. For example, a gate oxide layer 511 may be formed over the thinned Hall plate structure, followed by the formation of a polysilicon gate region 513. Then, source/drain (S/D) structures 515 and 517 and a Halo/LDD 519 can be formed into the opposing implantation regions 505 in which current is intended to flow through, as described above, followed by the formation of the spacers 521. The S/D structures 515 and 517 may then be spike annealed, followed by silicidation of the S/D regions 515 and 517 and the polysilicon gate region 513.

Further, although not illustrated, in accordance with an embodiment of the present disclosure, a front and a back gate may be formed, for example, at the top and bottom of the cross-shaped thinned Si layer 407' (or thinned Hall plate structure) to induce depletion to further enhance the sensitivity of the Hall plate structure. Providing a front and a back gate is especially beneficial when using the alternative UTBOX layer rather than the BOX layer 405, as described above.

The embodiments of the present disclosure can achieve several technical effects, including providing a Hall effect sensor device with an enhanced sensitivity using a process simpler than the known processes without requiring any additional masks. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any IC devices with a Hall effect sensor device.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a shallow trench isolation (STI) structure formed in a frame-shaped pattern in top view, the STI structure extending through a crossed-shaped silicon (Si) layer to a buried oxide (BOX) layer of a silicon-on-insulator (SOI) substrate in cross-section;
    the cross-shaped Si layer formed over the BOX layer, and the cross-shaped Si layer within and adjacent to the frame-shaped STI structure; and
    N+ type ion-doped implantation regions at opposite ends of the cross-shaped Si layer in top view, and formed in direct contact with the frame-shaped pattern of the STI structure in top view,
    wherein each N+ type ion-doped implantation region comprises a contact lead.

2. The device according to claim 1, wherein the cross-shaped Si layer has a thickness of 100 angstrom (Å) to 1000 Å.

3. The device according to claim 1, wherein the BOX layer has a thickness of 140 nanometer (nm) to 200 nm.

4. The device according to claim 1, wherein the BOX layer is an ultra-thin buried oxide (UTBOX) layer having a thickness of 10 nm to 30 nm.

5. The device according to claim 1, further comprising at least one gate formed on at least one side of the cross-shaped Si layer.

6. A device comprising:
    an isolation structure formed in a frame-shaped pattern in top view, the isolation structure extending through a cross-shaped silicon (Si) layer to an oxide layer of a silicon-on-insulator (SOI) substrate in cross section;

the cross-shaped Si layer formed over the oxide layer, and the cross-shaped Si layer within and adjacent to the frame-shaped isolation structure; and ion-doped implantation regions at opposite ends of the cross-shaped Si layer in top view, and formed in direct contact with the frame-shaped pattern of the STI structure in top view, wherein each ion-doped implantation region comprises a contact lead.

7. The device according to claim 6, wherein the cross-shaped Si layer has a thickness of 100 angstrom (Å) to 1000 Å.

8. The device according to claim 6, wherein the oxide layer comprises a buried oxide (BOX) layer.

9. The device according to claim 8, wherein the BOX layer has a thickness of 140 nanometer (nm) to 200 nm.

10. The device according to claim 8, wherein the BOX layer is an ultra-thin buried oxide (UTBOX) layer having a thickness of 10 nm to 30 nm.

11. The device according to claim 6, further comprising at least one gate formed on at least one side of the cross-shaped Si layer.

12. The device according to claim 6, wherein the isolation structure comprises shallow trench isolation (STI) structure.

13. The device according to claim 6, wherein the ion doped implantation regions comprise N+ type ion-doped implantation regions at the opposite ends of the cross-shaped Si layer.

14. The device according to claim 13, wherein an n-type dopant is implanted on the cross-shaped Si layer prior to implanting the N+ dopant ions.

15. The device according to claim 6, wherein the SOI substrate comprises a partially-depleted silicon-on-insulator (PDSOI).

16. A device comprising:

a silicon-on-insulator (SOI) substrate having a sequentially formed silicon (Si) substrate and an ultra-thin buried oxide (UTBOX) and a cross-shaped Si layer;

a shallow trench isolation (STI) structure formed in a frame-shaped pattern in top view and extending through the cross-shaped Si layer to the UTBOX layer in cross section;

the cross-shaped Si layer formed over the UTBOX layer, and the cross-shaped Si layer within and adjacent to STI structure; and N+ dopant ions implanted into opposite ends of the cross-shaped Si layer in top view to form N+ implantation regions in direct contact with the frame-shaped pattern of the STI structure in top view, wherein each N+ implantation region comprises a contact lead.

17. The device according to claim 16, wherein the SOI substrate comprises a partially-depleted silicon-on-insulator (PDSOI).

18. The device according to claim 17, wherein the UTBOX layer has a thickness of 10 nanometer (nm) to 30 nm.

19. The device according to claim 17, wherein an n-type dopant on the cross-shaped Si layer is implanted prior to the N+ dopant ion implantation.

* * * * *